United States Patent
Park

(10) Patent No.: US 8,243,515 B2
(45) Date of Patent: *Aug. 14, 2012

(54) READ COMPENSATION CIRCUITS AND APPARATUS USING SAME

(75) Inventor: Ki Tae Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 354 days.

This patent is subject to a terminal disclaimer.

(21) Appl. No.: 12/572,430

(22) Filed: Oct. 2, 2009

(65) Prior Publication Data

US 2010/0103737 A1    Apr. 29, 2010

(30) Foreign Application Priority Data

Oct. 28, 2008  (KR) .................. 10-2008-0105760

(51) Int. Cl.
*G11C 11/34* (2006.01)
(52) U.S. Cl. .......... 365/185.09; 365/185.29; 365/185.12
(58) Field of Classification Search .................. 365/185, 365/185.09, 185.29, 185.12
See application file for complete search history.

(56) References Cited

U.S. PATENT DOCUMENTS

| | | | |
|---|---|---|---|
| 2007/0171715 A1* | 7/2007 | Lee et al. | 365/185.12 |
| 2008/0055984 A1* | 3/2008 | Nazarian | 365/185.03 |
| 2008/0144368 A1 | 6/2008 | Kamei | |
| 2009/0080259 A1* | 3/2009 | Alrod et al. | 365/185.18 |
| 2010/0277979 A1* | 11/2010 | Kang et al. | 365/185.03 |

FOREIGN PATENT DOCUMENTS

| | | |
|---|---|---|
| KR | 1020060115992 A | 11/2006 |
| KR | 100724334 B1 | 5/2007 |
| KR | 1020080032103 A | 4/2008 |

* cited by examiner

*Primary Examiner* — Fernando Hidalgo
(74) *Attorney, Agent, or Firm* — Myers Bigel Sibley & Sajovec

(57) ABSTRACT

A read compensation circuit is provided. The read compensation circuit corrects a read error occurring in an erased cell based on a pattern of programmed cells adjacent to the erased cell. The read compensation circuit also transmit program state information of a memory cell stored in a page buffer to another page buffer through a bit line, thereby allowing page buffers to easily detect and correct errors occurring in memory cells.

18 Claims, 15 Drawing Sheets

FIG. 3

| | | Program Disturbance | Total Coupling (P1:P2:P3)= (0.4:0.7:1) | Total Vth Shift | Compensation Read Level ($R < R' \leq R_{EP1}$) |
|---|---|---|---|---|---|
| 1 | P3-E-P3 | $\Delta V_D * 2$ | $\Delta V_C * 4$ | $(\Delta V_D * 2) + (\Delta V_C * 4)$ | R' |
| 2 | P3-E-P2 | $\Delta V_D * 1.2$ | $\Delta V_C * 3.7$ | $(\Delta V_D * 1.2) + (\Delta V_C * 3.7)$ | |
| 3 | P3-E-P1 | $\Delta V_D * 1$ | $\Delta V_C * 4.4$ | $(\Delta V_D * 1) + (\Delta V_C * 4.4)$ | |
| 4 | P3-E-E | $\Delta V_D * 0.3$ | $\Delta V_C * 3$ | $(\Delta V_D * 0.3) + (\Delta V_C * 3)$ | |
| 5 | P2-E-P2 | — | $\Delta V_C * 3.4$ | $\Delta V_C * 3.4$ | R |
| 6 | P2-E-P1 | — | $\Delta V_C * 3.1$ | $\Delta V_C * 3.1$ | |
| 7 | P2-E-E | — | $\Delta V_C * 2.7$ | $\Delta V_C * 2.7$ | |
| 8 | P1-E-P1 | — | $\Delta V_C * 2.8$ | $\Delta V_C * 2.8$ | |
| 9 | P1-E-E | — | $\Delta V_C * 2.4$ | $\Delta V_C * 2.4$ | |
| 10 | E-E-E | — | $\Delta V_C * 2$ | $\Delta V_C * 2$ | |

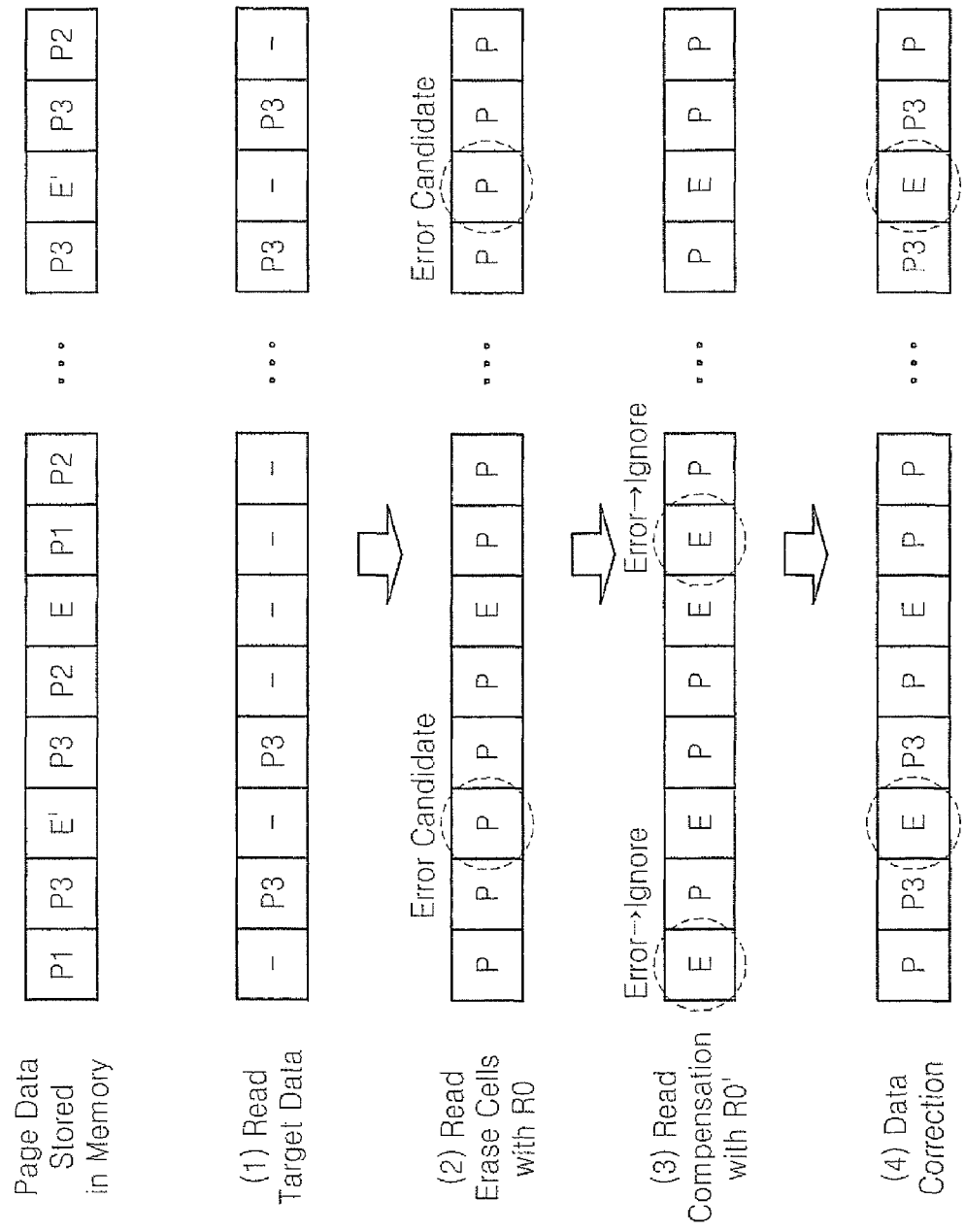

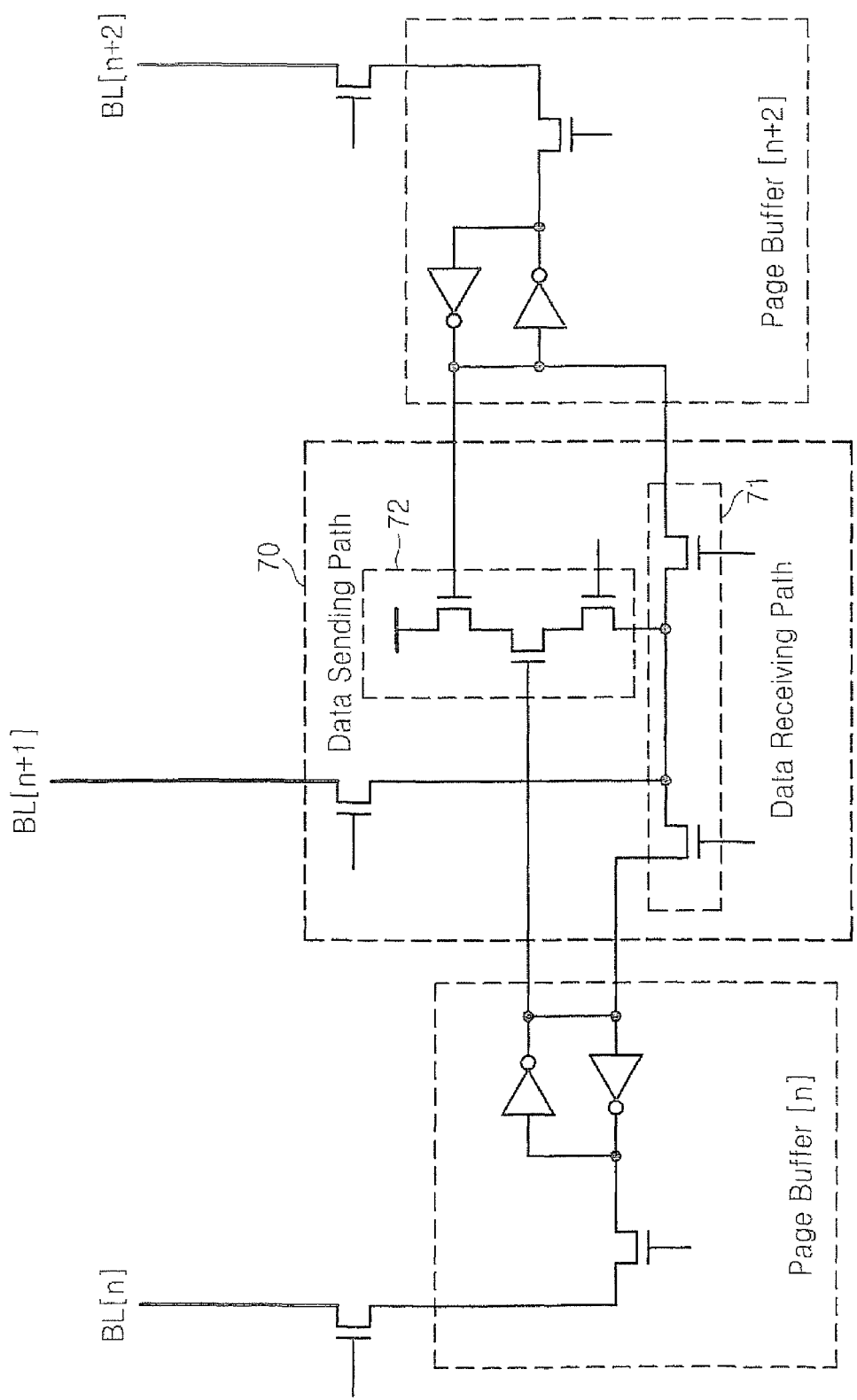

READ COMPENSATION CIRCUITS AND APPARATUS USING SAME

CROSS-REFERENCE TO RELATED APPLICATIONS

This application claims priority to Korean Patent Application No. 10-2008-0105760, filed Oct. 28, 2008, the contents of which are herein incorporated by reference in its entirety as if set forth fully herein.

BACKGROUND

The present invention relates to circuits and, more particularly, to error correcting circuits.

NAND-type flash memory may include memory cells connected in series between a drain selection transistor and a source selection transistor. The number of memory cells may vary with devices or density.

In the NAND-type flash memory, the channel voltage of a programmed cell may be nearly 0 V while the channel voltage of an erased cell may be boosted up to about 9 V. However, the channel voltage may not satisfactorily increase due to a parasitic capacitor generated between channels of the two cells, which may cause program disturbance. Moreover, a coupling effect may occur between cells adjacent in a bit line direction due to a parasitic capacitor, and therefore, the threshold voltage of a memory cell intervened between two cells adjacent in the bit line direction may increase.

Each possible program states of a memory cell may have a fixed threshold voltage distribution, and therefore, when the threshold voltage distribution shifts due an external environment factor, a likelihood of error occurrence may increase during a data read operation.

SUMMARY

Some embodiments of the present invention provide read compensation circuits for correcting a read error in an erased cell based on information of adjacent cells. Some embodiments of the present invention provide read compensation circuits for detecting and correcting an error by transmitting program state information of a memory cell to a page buffer through a bit line.

Some embodiments of the present invention provide read compensation circuits for performing mapping conversion to convert data sent from a memory cell to an external controller into physical data, identifying a pattern of adjacent cells, and correcting a read error in an erased cell.

According to some embodiments of the present invention, there is provided a read compensation circuit including a plurality of memory cells including at least one erased cell and a correction circuit configured to correct an error in the erased cell based on program state information of cells adjacent to the erased cell. The correction circuit may include a plurality of page buffers respectively connected with the plurality of memory cells. Each of the page buffers may store the program state information of a memory cell connected with each page buffer among the plurality of memory cells and send the program state information to other page buffers among the plurality of page buffers.

The plurality of page buffers may be divided into a first page buffer block and a second page buffer block separated from the first page buffer block by the plurality of memory cells. One of the first and second page buffer blocks may send the program state information to the other of the first and second page buffer blocks through a bit line.

The read compensation circuit may further include a control logic configured to output a control signal for correcting the program state information stored in the plurality of page buffers. At least one of the plurality of page buffers may correct the program state information in response to the control signal.

The at least one of the plurality of page buffers may correct the program state information of the erased cell whose total threshold voltage shift exceeds a predetermined value in response to the control signal. The total threshold voltage shift may be determined based on at least one between program disturbance and coupling occurring due to the cells adjacent to the erased cell.

The plurality of page buffers may perform a read operation using a first level as a reference and determine the program state information of the respective memory cells. The at least one of the plurality of page buffers may perform a read operation using a second level greater than the first level in response to the control signal to correct the program state information of the erased cell.

The correction circuit may be a controller configured to receive the program state information from each of the memory cells and check whether error correcting code (ECC) correction has been successful.

The controller may include a read engine configured to correct the error in the erased cell based on the program state information of the cells adjacent to the erased cell. When the ECC correction has failed, the controller may perform mapping conversion to convert the program state information received from the plurality of memory cells into physical data and input the physical data to the read engine.

The read engine may correct the program state information of the erased cell whose total threshold voltage shift exceeds a predetermined value based on the physical data.

Some embodiments of the present invention include a read compensation circuit that includes multiple memory cells including at least one erased cell, and a correction circuit that is configured to correct an error in the erased cell based on program state information of cells adjacent the erased cell. The correction circuit may include multiple page buffers that are connected to respective ones of the memory cells. The read compensation circuit may include a control logic that is configured to output a control signal for correcting the program state information stored in the page buffers. At least one of the page buffers may correct the program state information in response to the control signal.

In some embodiments, each of the page buffers stores the program state information of a memory cell connected with each page buffer among the memory cells and sends the program state information to other page buffers among the page buffers. Some embodiments provide that the page buffers are divided into a first page buffer block and a second page buffer block separated from the first page buffer block by the memory cells. One of the first and second page buffer blocks may send the program state information to an other of the first and second page buffer blocks through a bit line.

Some embodiments provide that the at least one of the page buffers corrects the program state information of the erased cell whose total threshold voltage shift exceeds a predetermined value in response to the control signal. In some embodiments, the total threshold voltage shift is determined based on at least one between program disturbance and coupling occurring due to the cells adjacent the erased cell.

Some embodiments provide that the page buffers perform a read operation using a first level as a reference and determine the program state information of the respective memory cells and the at least one of the page buffers performs a read operation using a second level greater than the first level in response to the control signal to correct the program state information of the erased cell.

In some embodiments, the correction circuit includes a controller that is configured to receive the program state information from each of the memory cells and to check whether error correcting code (ECC) correction has been successful. Some embodiments provide that the controller includes a read engine that is configured to correct the error in the erased cell based on the program state information of the cells adjacent the erased cell and, when the ECC correction has failed, the controller performs mapping conversion to convert the program state information received from the plurality of memory cells into physical data and input the physical data to the read engine.

Some embodiments provide that the read engine corrects the program state information of the erased cell whose total threshold voltage shift exceeds a predetermined value based on the physical data.

Some embodiments of the present invention include a memory storage apparatus that includes a read compensation circuit according embodiments as described herein.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

FIG. 3 is a table showing calculation of threshold voltage shift amounts according to different program states of cells adjacent to an erased cell according to some embodiments of the present invention.

FIG. 4 is a schematic diagram for explaining error correction methods according to some embodiments of the present invention.

FIG. 7 is a circuit diagram showing a path through which a page buffer transmits program state information to another page buffer according to some embodiments of the present invention.

DETAILED DESCRIPTION

Figure 1:
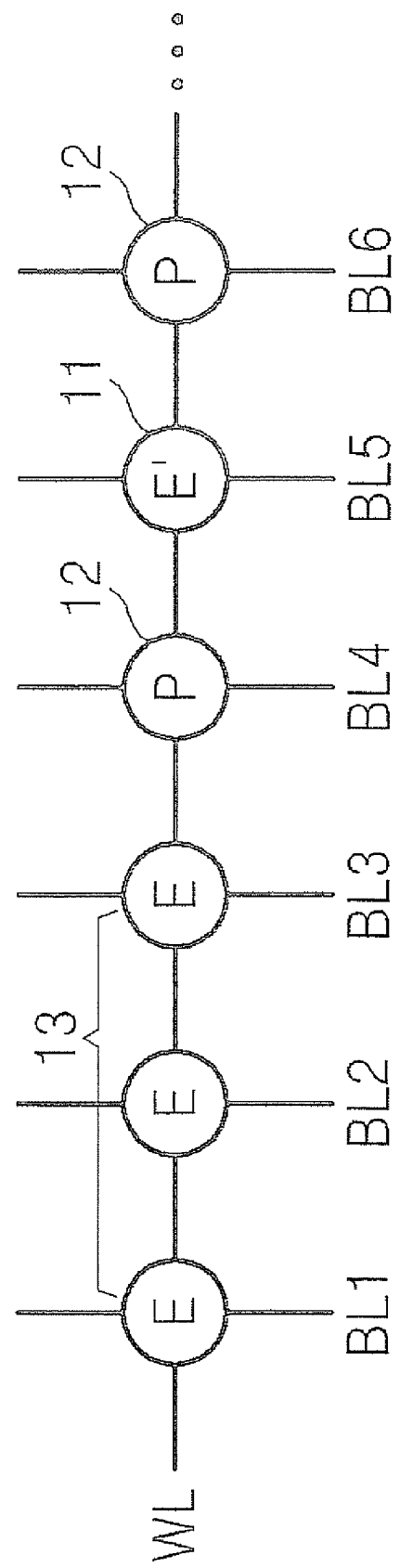
FIG. 1 is a schematic diagram for explaining influence exerted on an erased cell by adjacent programmed cells according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

FIG. 1 is a schematic diagram for explaining influence exerted on an erased cell by adjacent programmed cells according to some embodiments of the present invention. Referring to FIG. 1, when an erased cell 11 is between programmed cells 12, the erased cell 11 may be subjected to program disturbance due to the adjacent programmed cells 12 and a threshold voltage Vth of the erased cell 11 may greatly shift due to a coupling effect occurring in a bit line direction (i.e., a horizontal direction in FIG. 1).

Although disturbance and/or coupling occurring in the bit line direction is only illustrated in FIG. 1, the threshold voltage Vth of the erased cell 11 may be affected by disturbance and/or coupling occurring in a word line direction (i.e., a vertical direction in FIG. 1) according to some embodiments of the present invention. Six bit lines BL1 through BL6 are illustrated in FIG. 1, but the present invention is not restricted to the illustrated embodiments and can be applied to applications having any number of bit lines.

Erased cells 13, which are not adjacent the programmed cells 12 may have a low likelihood of error occurrence during a read operation and are therefore excluded from targets of error correction in some embodiments of the present invention.

Figure 2:
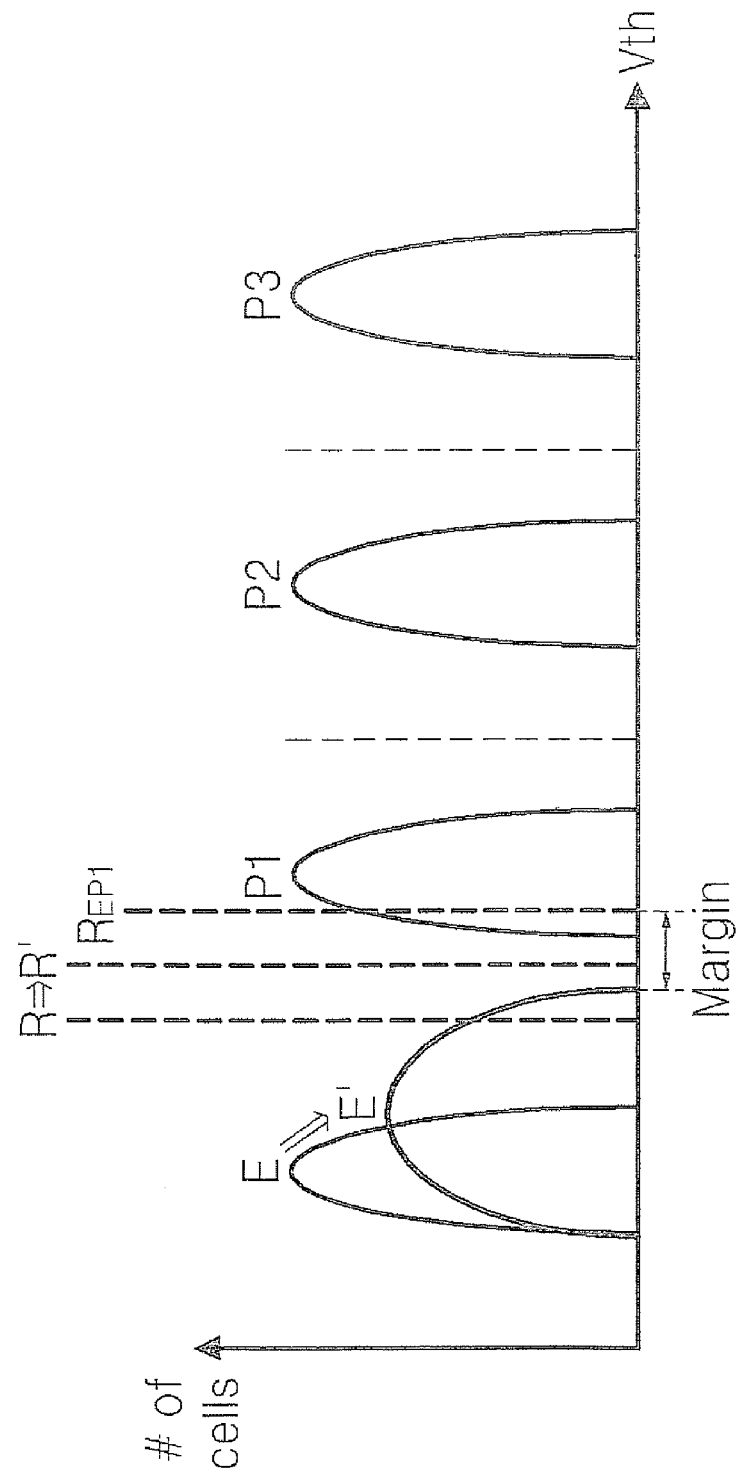
FIG. 2 is a graph for explaining read level compensation performed in error correction according to some embodiments of the present invention.

FIG. 2 is a graph for explaining read level compensation performed in error correction according to some embodiments of the present invention. Referring to FIGS. 1 and 2, the x-axis is a threshold voltage Vth and the y-axis is the number of cells having the threshold voltage Vth in FIG. 2. In some embodiments of the present invention, a memory cell may be implemented by a multi-level cell (MLC) and may be in one of four states E, P1, P2, and P3 as illustrated in FIG. 2.

In some embodiments, "program states" may include four states, which may be referred to as an erased state E, a first programmed state P1, a second programmed state P2, and a third programmed state P3. Referring to FIG. 2, the states E, P1, P2, and P3 may respectively have threshold voltage ranges that do not overlap one another. Accordingly, a read circuit (not shown) may perform a read operation based on an arbitrary level value existing in each threshold voltage range, thereby identifying the states E, P1, P2, and P3. For example, to distinguish the erased state E from the programmed states P1, P2, and P3, a level R may be used as a reference.

However, when the programmed cells 12 are around the erased cell 11, causing the threshold voltage Vth of the erased cell 11 to increase as illustrated in FIG. 1, the original erased state E may change into a shifted erased state E', as illustrated in FIG. 2. If the read circuit performs the read operation on an erased cell, which may have a threshold voltage Vth shifted due to adjacent cells, based on the level R, the erased cell may be wrongly identified as a programmed cell, which may result in a read error.

A read compensation circuit according to some embodiments of the present invention may change a reference level when performing a read operation on an erased cell based on a pattern of cells adjacent the erased cell. For instance, when the shift amount of the threshold voltage Vth of the erased cell exceeds a predetermined value, the read compensation circuit may perform the read operation based on a level R' that is different from the level R. In some embodiments, the level R' may be greater than the level R and may vary with applications.

Accordingly, when the shift amount of the threshold voltage Vth of a memory cell is large due to high disturbance and/or coupling, an error that may occur in the memory cell may be prevented by changing the reference level for identifying the erased state E from the level R to the level W.

FIG. 3 is a table showing calculation of threshold voltage shift amounts according to different program states of a cell adjacent to an erased cell. Referring to FIGS. 1 through 3, FIG. 3 is a table showing the magnitudes of disturbance and/or coupling to which an erased cell in the erased state E at the center is subject to when cells above and below the erased cell (i.e., cells adjacent the erased cell in the vertical direction) are in the third programmed state P3 and the program states of cells S1 and S3 adjacent to the erased cell in the bit line direction (i.e., the horizontal direction) are changed.

A total of 10 cases are shown in the table illustrated in FIG. 3. Both of the cells S1 and S3 are in the third programmed state P3 in the first case and are in the erased state E in the last case. Referring to FIG. 3, a program disturbance may occur when at least one cell between the cells S1 and S2 adjacent the erased cell in the bit line direction is in the third programmed state P3. Accordingly, the program disturbance may appear in only the first through fourth cases. Values of 2, 1.2, 1, and 0.3 of the program disturbance shown in the table in FIG. 3 were obtained from experiments and may vary according to some embodiments.

The erased cell in the erased state E may be affected by coupling with the four cells adjacent thereto in the vertical and horizontal directions. A total coupling imposed on the erased cell is shown at the fourth column of the table in FIG. 3. A coupling to a cell in the third programmed state P3 may be greater than a coupling to a cell in the first programmed state P1. Therefore, when a coupling rate was set to "P1:P2:P3=0.4:0.7:1", experimental results shown at the fourth column of the table illustrated in FIG. 3 were obtained.

The coupling rate with respect to the programmed states P1 through P3 may be obtained through experiments and may vary with embodiments. Accordingly, the amount of shift of the threshold voltage Vth (referred to as a "total Vth shift") of the erased cell may be affected by both of the program disturbance and the total coupling. In this regard, experimental results shown at the fifth column of the table illustrated in FIG. 3 may be obtained. As described above, the read compensation circuit may perform the read operation using the new level R' as the reference level when the total Vth shift of a memory cell exceeds the predetermined value, which may vary with applications. Referring to FIG. 3, an error correction method according to some embodiments of the present invention may be used in the first through third cases.

The new reference level R' may be greater than the level R and less than a level $R_{EP1}$ obtained considering the total Vth shift of a cell in the first programmed state P1 when cells in the third programmed state P3 are adjacent the cell in the first programmed state P1. The level $R_{EP1}$ may be greater than the minimum of the threshold voltage range corresponding to the first programmed state P1. Accordingly, the level R' can secure sufficient margin.

FIG. 4 is a schematic diagram for explaining an error correction method according to some embodiments of the present invention. Referring to FIGS. 1 through 4, each of memory cells included in a memory array may be in one state among the first through third programmed states P1 through P3 and the erased state E or E as illustrated in FIG. 4.

In step (1), target data cells may be read by a read circuit (not shown). FIG. 4 illustrates an example of correcting a read error that may occur in an erased cell positioned between cells in the third programmed state P3, and therefore, the target data cells may be at least one memory cell in the third programmed state P3.

In step (2), the read circuit may determine the program state of each memory cell based on the level R. Since the read operation is performed based on the level R, the read circuit can identify whether each memory cell is in the programmed state P or the erased state E. At this time, when a cell positioned between cells in the third programmed state P3 is in the programmed state P, the cell is considered as having a high likelihood of having a read error.

In third step (3), the read circuit may determine the program state of each memory cell based on the level R'. At this time, only an error candidate cell having the high error likelihood may be subjected to an additional read operation performed by a page buffer and/or determining the program state may be performed based on the level R' with respect to all of the memory cells. In the latter case, if a cell determined as being in the programmed state P in step (2) is determined as being in the erased state E in step (3), the determination made in step (3) may be ignored.

In step (4), the read circuit may correct a read error occurring in each memory cell using a result of the read operation performed in step (3). Referring to FIG. 4, error candidate cells may be determined as being in the erased state E when the read operation has been performed based on the level R', and therefore, the read circuit may correct the state of the error candidate cells into the erased state E.

As described above, a method of correcting a read error according to some embodiments of the present invention may be implemented in a plurality of buffers included in a memory array and/or may be implemented in an external controller.

Hereinafter, an error correction algorithm performed by internal page buffers according to some embodiments of the present invention will be described with reference to FIGS. 5 through 8 and an error correction algorithm performed by an external controller according to some other embodiments of the present invention will be described with reference to FIGS. 9 through 11.

Figure 5:
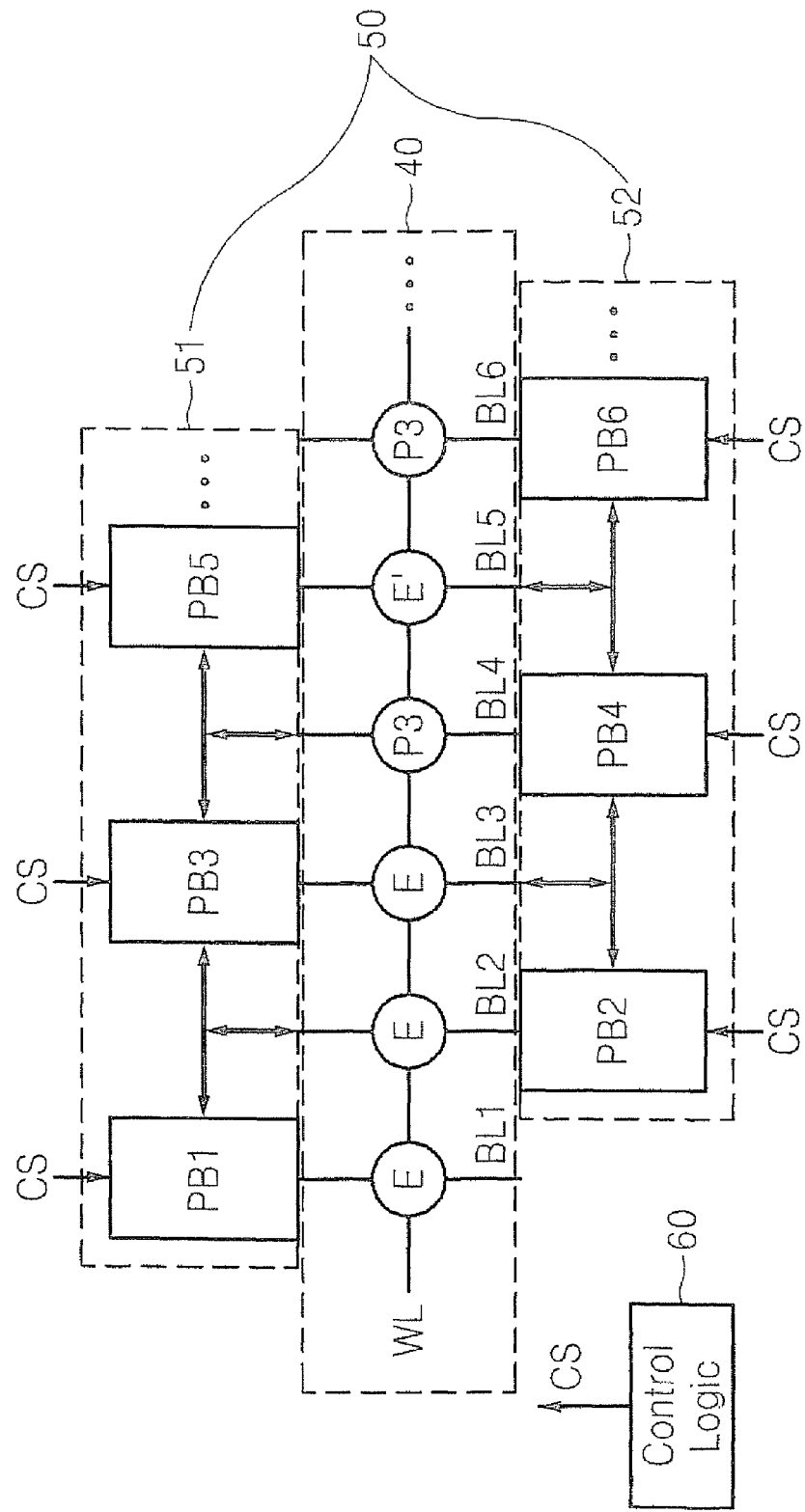
FIG. 5 is a schematic block diagram of a read compensation circuit according to some embodiments of the present invention.

FIG. 5 is a schematic block diagram of a read compensation circuit according to the some embodiments of the present invention. The read compensation circuit may include a memory cell unit 40 including a plurality of memory cells and a page buffer unit 50 including a plurality of page buffers PB1 through PB6. Memory cells may be formed at the intersections between a word line WL and bit lines BL1 through BL6. The page buffers PB1 through PB6 may be connected with the bit lines BL1 through BL6, respectively.

A first page buffer block 51 including the page buffers PB1, PB3, and PB5 that are respectively connected with odd bit lines BL1, BL3, and BL5 may be spatially separated from a second buffer block 52 including the page buffers PB2, PB4, and PB6 that are respectively connected with the even bit lines BL2, BL4, and BL6. Some embodiments provide that the first page buffer block 51 and the second buffer block 52 may be separated from each other with intervention of the memory cell unit 40 therebetween. For instance, the first page buffer block 51 and the second buffer block 52 may be disposed above and below, respectively, the memory cell unit 40.

Each of the page buffers PB1 through PB6 may read data from a memory cell in the memory cell unit 40 and store program state information (e.g., E, P1, P2, or P3) of the memory cell. Each of the page buffers PB1 through PB6 may transmit the program state information to other page buffers. For instance, the page buffer PB4 may transmit the program state information stored therein to its adjacent page buffers PB2 and PB6 using a data path and/or to the spatially separated page buffer PB3 or PB5 through a bit line (e.g., BL4). Accordingly, each of the page buffers PB1 through PB6 may store the program state information of a certain memory cell on a bit line connected thereto and the program state information of memory cells adjacent the certain memory cell.

The read compensation circuit according to some embodiments may also include a control logic 60 therewithin. The control logic 60 may output a control signal CS for correcting the program state information stored in the page buffers PB1 through PB6. The control signal CS output from the control logic 60 may be transmitted to the page buffers PB1 through PB6.

The page buffers PB1 through PB6 may receive the program state information of adjacent cells and may determine whether to perform error correction based on the received program state information. As described above, the page buffers PB1 through PB6 may selectively perform the error correction with respect to only cells whose total Vth shift exceeds a predetermined value in response to the control signal CS. As mentioned above, the total Vth shift of each cell may be affected by the program states of adjacent cells.

For instance, a cell on the bit line BL5 may have adjacent cells all in the third programmed state P3 in FIG. 5, which may correspond to the case having the greatest total Vth shift in the table illustrated in FIG. 3. Accordingly, the page buffer PB5 connected with the bit line BL5 may re-read the cell on the bit line BL5 using the level R' instead of the level R as a reference level, thereby correcting a read error.

As illustrated in FIG. 5, the first page buffer block 51 may include at least one page buffer connected with at least one odd bit line and the second buffer block 52 may include at least one page buffer connected with at least one even bit line. In some embodiments, the arrangement of page buffer blocks may be different from that illustrated in FIG. 5. Some embodiments of the present invention may be applied to any memory arrays including a plurality of spatially separated page buffer blocks.

Figure 6A:
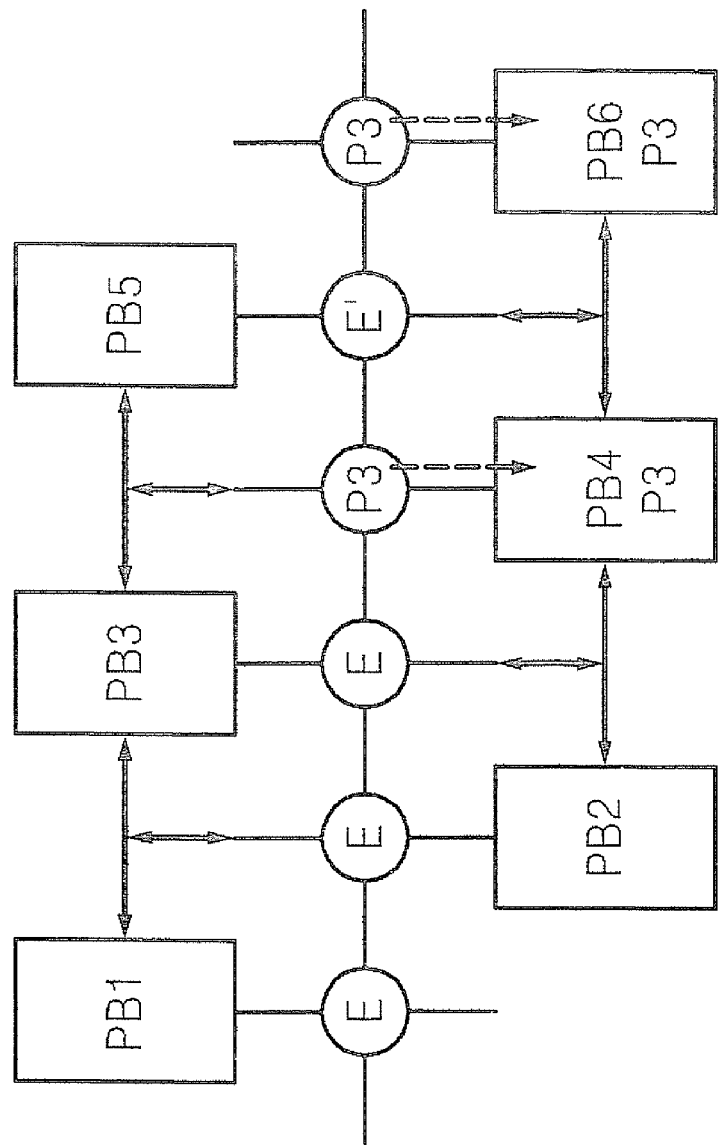
FIGS. 6A through 6D are schematic diagrams for explaining an error correction method according to some embodiments of the present invention.

FIGS. 6A through 6D are schematic diagrams for explaining an error correction method performed by the read compensation circuit illustrated in FIG. 5. Referring to FIG. 6A, target cells may be read using the page buffers PB1 through PB6. As described above, in FIGS. 6A through 6D, an erased cell positioned between adjacent cells in the third programmed state P3 may be subjected to error correction. Accordingly, in FIG. 6A, target cells in the third programmed state P3 are read using the page buffers PB1 through PB6. The page buffers PB1 through PB6 may perform a read operation based on a level between the maximum level of a voltage range corresponding to the second programmed state P2 and the minimum level of a voltage range corresponding to the third programmed state P3.

Figure 6B:
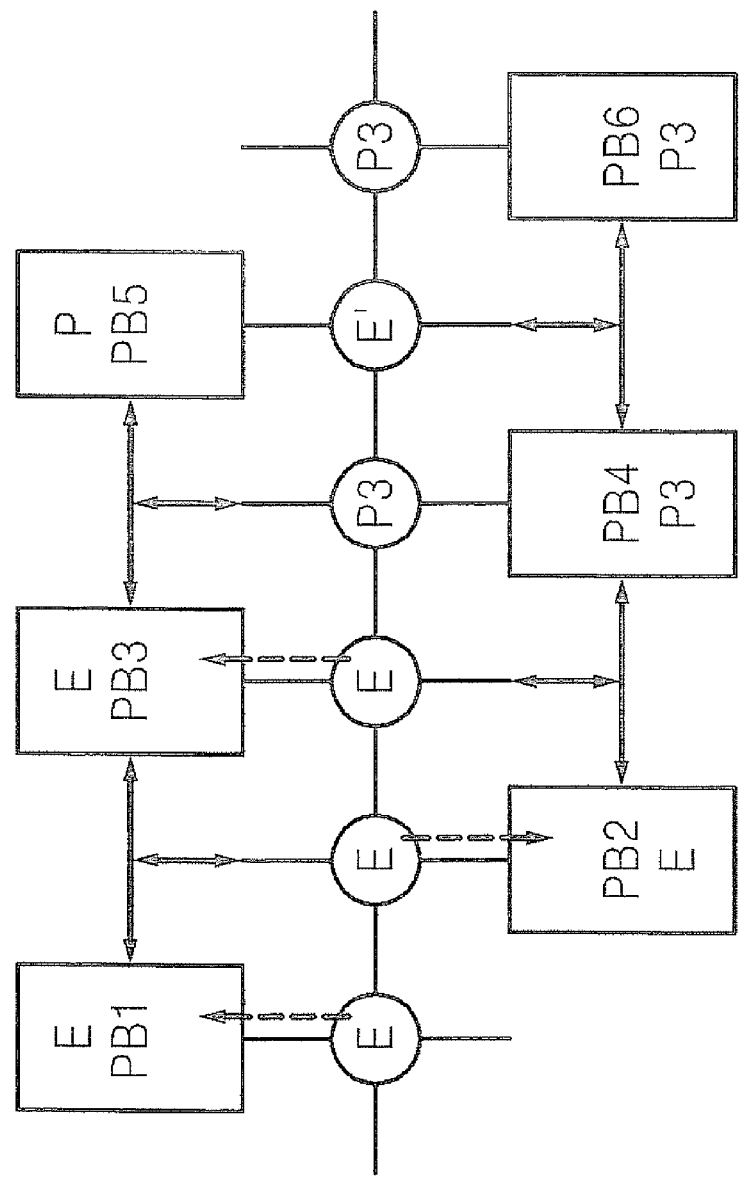

Next, referring to FIG. 6B, at least one cell in the erased state E may be read using the page buffers PB1 through PB6 based on the level R. In detail, the page buffers PB1, PB2, PB3, and PB5 respectively connected with cells in any program state except for the third programmed state P3 may perform the read operation using the level R and therefore may identify whether each of the cells connected therewith is in the erased state E or the programmed state P. In FIG. 6B, the first through third cells are identified as being in the erased state E and the fifth cell is identified as being in the programmed state P.

Figure 6C:
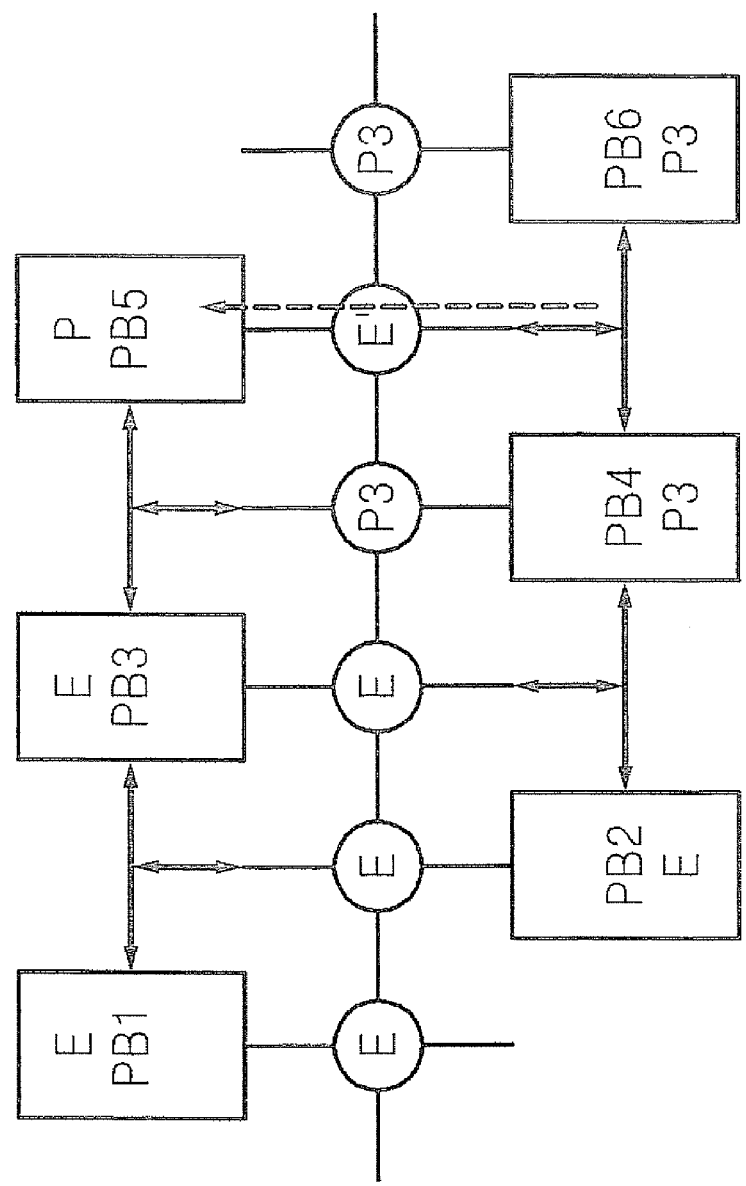

Next, referring to FIG. 6C, program state information stored in each of the page buffers PB1 through PB6 may be transmitted to adjacent page buffers and/or spatially separated page buffers. As described above, some embodiments provide that page buffers separated by a memory cell unit may communicate the program state information with each other using a bit line. When the communication of the program state information is completed among the page buffers PB1 through PB6, each of the page buffers PB1 through PB6 may have the program state information of a cell connected therewith and the program state information of adjacent cells.

Figure 6D:
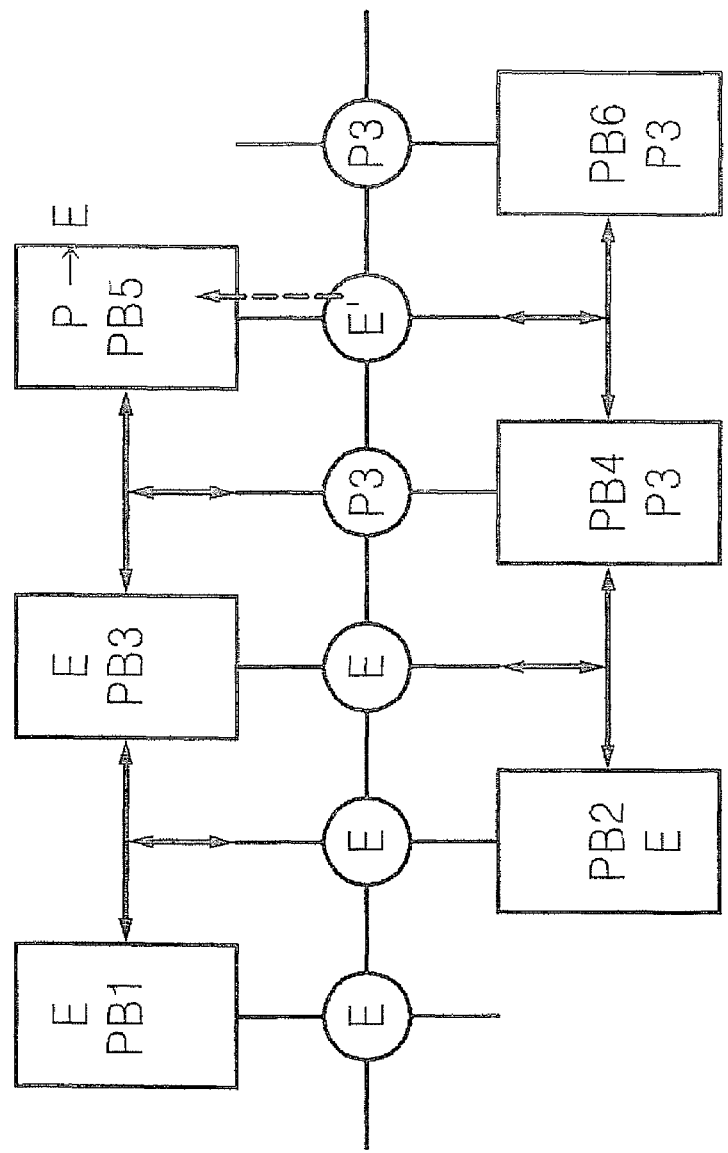

Next, referring to FIG. 6D, a read operation for error correction may be performed with respect to only a cell having a high likelihood of having an error based on the program state information stored in page buffers PB1 through PB6. As described above with reference to FIG. 6A, a cell positioned between the cells in the third programmed state P3 may be subjected to the error correction. In this regard, the page buffer PB5 that has received the program state information from the page buffers PB4 and PB6 may read the cell connected therewith based on the level R'. When the page buffer PB5 identifies the cell as being in the erased state E as a result of performing the read operation based on the level R', the page buffer PB5 may correct the program state information of the fifth cell connected therewith from the programmed state P into the erased state E.

In other words, the fifth cell may be read as being in the programmed state P, as illustrated in FIG. 6B, even when it is actually in the erased state E. Such error can be corrected by a page buffer subsequently performing a read operation based on a new level (e.g., the level R') after the setting of target cells and the communication of program state information among page buffers.

FIG. 7 is a circuit diagram showing a path through which a page buffer transmits program state information to another page buffer according to some embodiments of the present invention. Some embodiments provide that odd page buffers may be separated from even page buffers by a memory cell unit. Program state information of a memory cell stored in an each page buffer may be sent to a spatially separated page buffer using a bit line.

Referring to FIG. 7, program state information stored in a page buffer [n] and program state information stored in a page buffer [n+2] may be sent to a page buffer [n+1] (not shown) through a data transfer circuit 70 and a bit line [n+1]. The data transfer circuit 70 may include a data receiving path 71 and a data sending path 72. Transistors included in each of the paths 71 and 72 may be turned on or off in response to a transfer enable signal (not shown). In this manner, an error that may occur in a memory cell may be corrected through data communication between page buffers included in a memory array.

Figure 8:
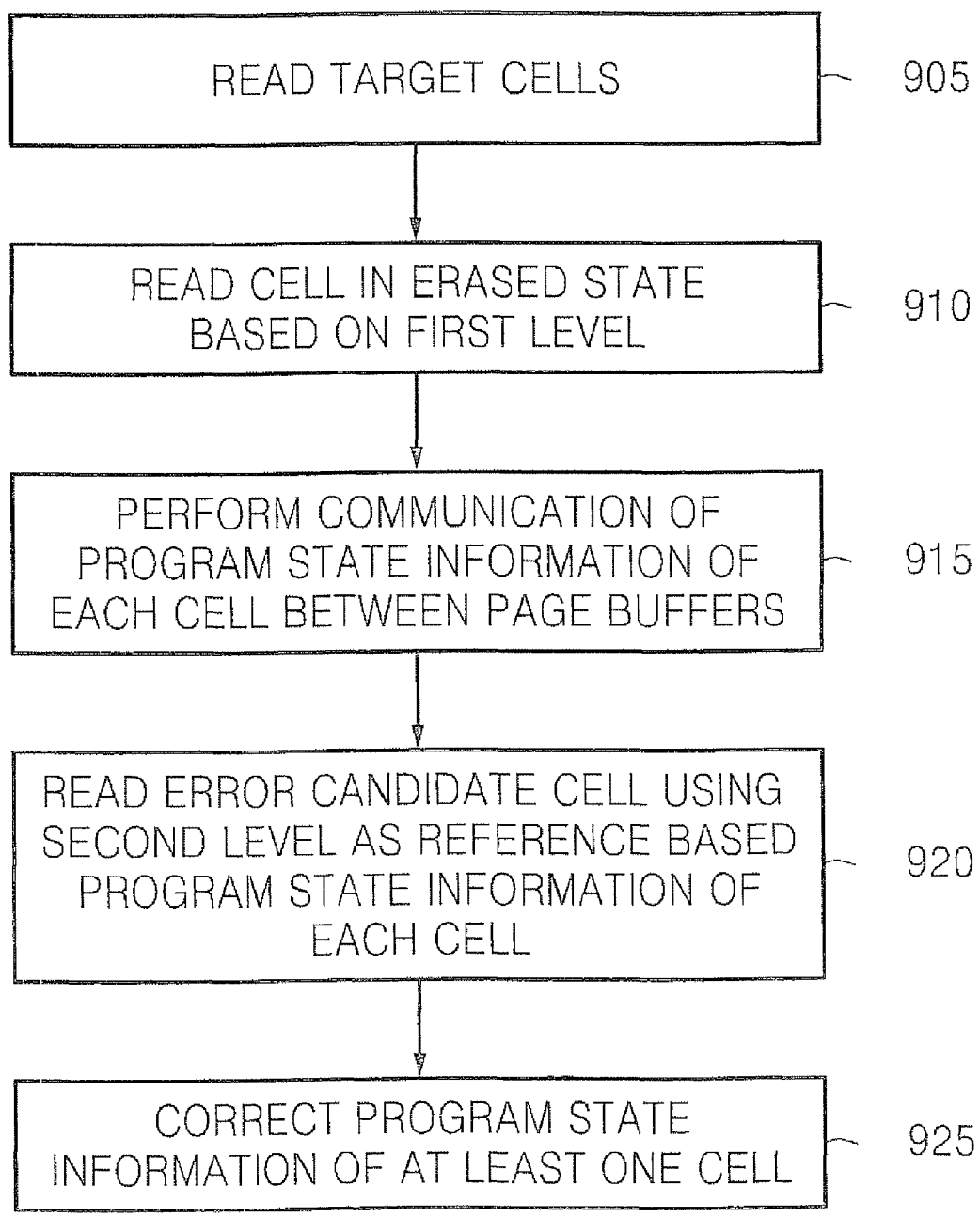
FIG. 8 is a schematic flowchart of error correction performed within a memory array according to some embodiments of the present invention.

Some embodiments provide that error correction may be performed by an external controller in some other embodiments of the present invention. FIG. 8 is a schematic flowchart of error correction performed within a memory array according to some embodiments of the present invention. Referring to FIGS. 5 and 8, target cells (e.g., cells in the third programmed state P3) may be read using the page buffers PB1 through PB6 (block 905). A cell in the erased state E may be read based on a first level (e.g., the level R) using the page buffers PB1 through PB6 (block 910). Program state information of each cell stored in a page buffer connected to the cell among the page buffers PB1 through PB6 may be sent to other page buffers through a bit line (block 915).

Based on the program state information of each cell, an error candidate cell (e.g., a cell positioned between cells in the third programmed state P3) may be read by a page buffer connected therewith using a second level (e.g., the level R') as a reference (block 920). Program state information erroneously stored as the programmed state P may be corrected into the erased state E (block 925).

Figure 9:
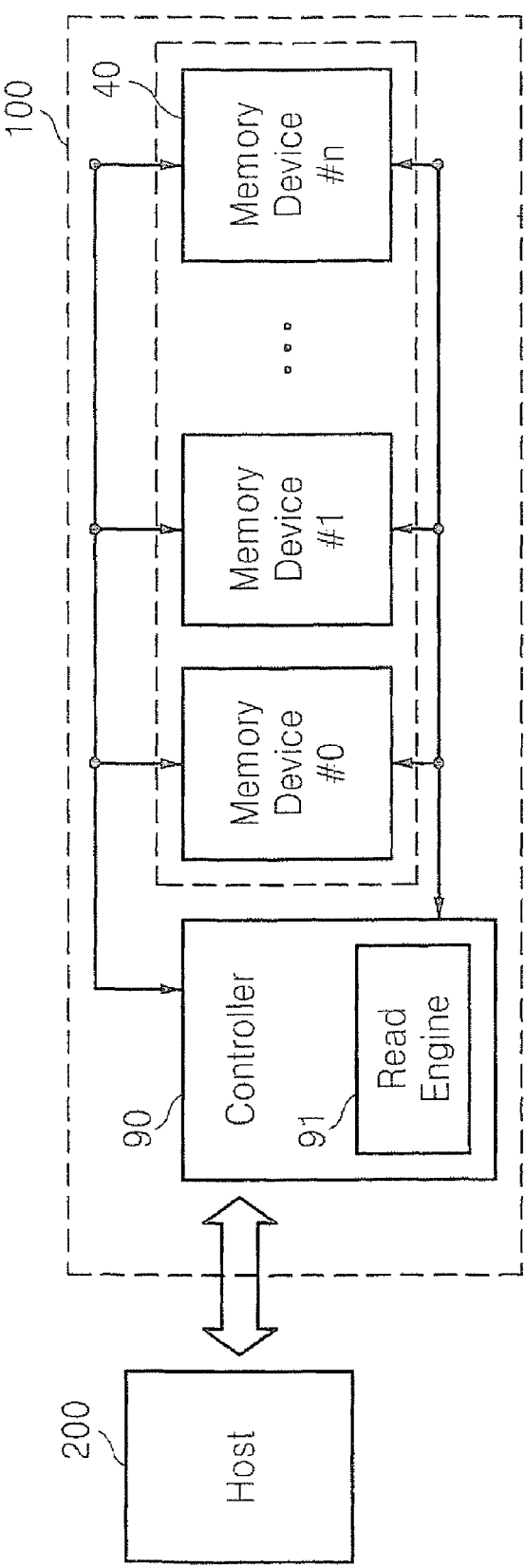
FIG. 9 is a schematic block diagram of a memory system when error correction is performed by a controller outside a memory array according to some embodiments of the present invention.

FIG. 9 is a schematic block diagram of a memory apparatus 100 when error correction is performed by a controller outside a memory array according to some other embodiments of the present invention. The memory apparatus 100 may include a memory device 40 and a controller 90. The memory device 40 may include a memory array including a plurality of page buffers (not shown).

The controller 90 may receive program state information from each memory cell and check whether error correcting code (ECC) correction has been performed successfully. In addition, the controller 90 may include a read engine 91 to correct an error in each memory cell based on the program state information of cells adjacent an erased cell.

The controller 90 may receive the program state information of each memory cell from the memory device 40 in response to a read command (not shown) output from the host 200. The controller 90 may perform ECC correction on received read data and may transmit the read data to the host 200 when the ECC correction has been performed successfully. In some embodiments, a code used for ECC correction may have unique error correction capability. For instance, when a code has an error correction capability of t=24 and n=4096, ECC decoding may be successfully performed when the number of bits having an error is 24 or less in a data block of 4096 bits.

When the ECC correction performed by the controller 90 fails, error correction according to some embodiments of the present invention can be performed. For example, methods as described above regarding FIG. 4 may be performed. In such circumstances, the program state information of each memory cell may be transmitted to the read engine 91 instead of to the page buffers. The controller 90 may receive logical data from each memory cell and perform mapping conversion to convert the logical data into physical data.

The read engine 91 may receive the physical data obtained through mapping conversion and correct a read error that may occur in an erased cell based on the physical data. The controller 90 may control the read engine 91 to identify a cell in an erased state using the level R', so that the error that may occur in the cell may be corrected. After the error correction by the read engine 91 is completed, the controller 90 may repeat the ECC correction and transmit error-corrected data to the host 200 when the ECC correction has been successful.

Figure 10:
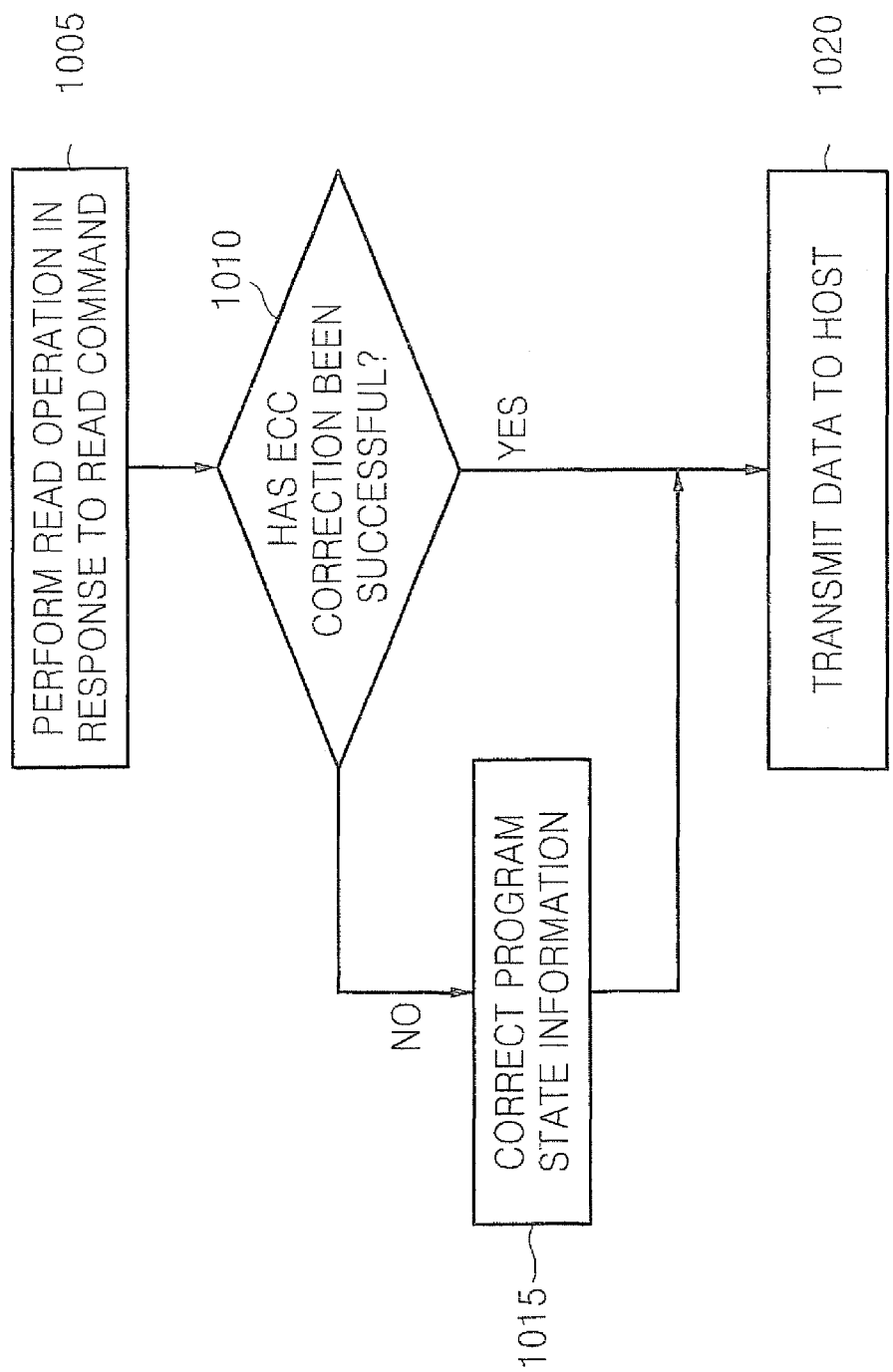
FIG. 10 is a schematic flowchart of error correction performed by a controller outside a memory array according to some embodiments of the present invention.

FIG. 10 is a flowchart of error correction performed by the controller 90 according to some embodiments of the present invention. Referring to FIGS. 9 and 10, the controller 90 may read data from the memory device 40 in response to a read command from an external device (e.g., the host 200) (block 1005). The controller 90 may perform ECC correction and determine whether the ECC correction has been successful (block 1010).

When the ECC correction has been successful, the controller 90 may transmit the data to the host 200 (block 1020). When the ECC correction has failed, the read engine 91 included in the controller 90 may perform an additional read operation using the level R', thereby correcting the program state information of cells having a high likelihood of having an error (block 1015). The controller 90 may transmit error-corrected data to the host 200 (block 1020).

Figure 11:
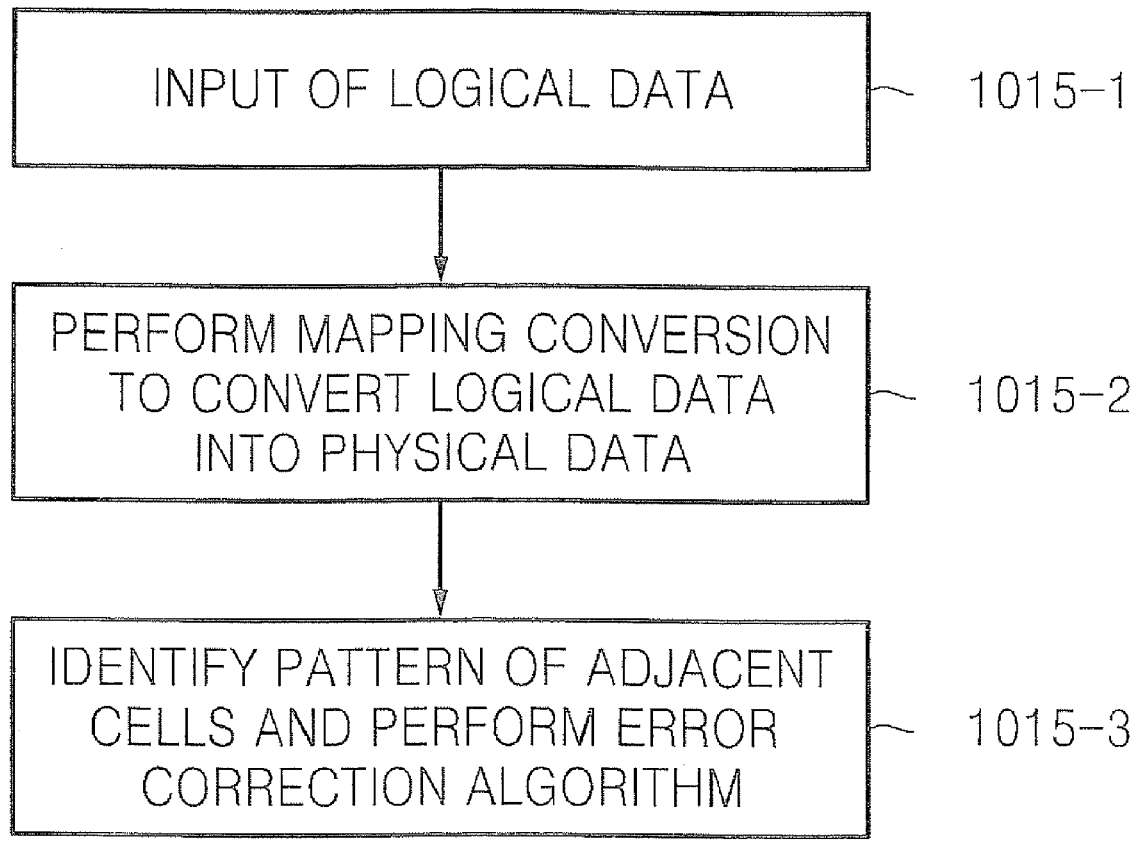
FIG. 11 is a detailed flowchart of the operation of correcting program state information in the error correction illustrated in FIG. 10.

FIG. 11 is a detailed flowchart of operation performed in block 1015 in the error correction described above regarding FIG. 10. Referring to FIGS. 9 through 11, when logical data is input from the memory device 40 (block 1015-1), the controller 90 may perform mapping conversion to convert the logical data into physical data (block 1015-2). The read engine 91 may identify the pattern of cells adjacent to an erased cell based on the physical data and perform an error correction algorithm (block 1015-3).

Figure 12:
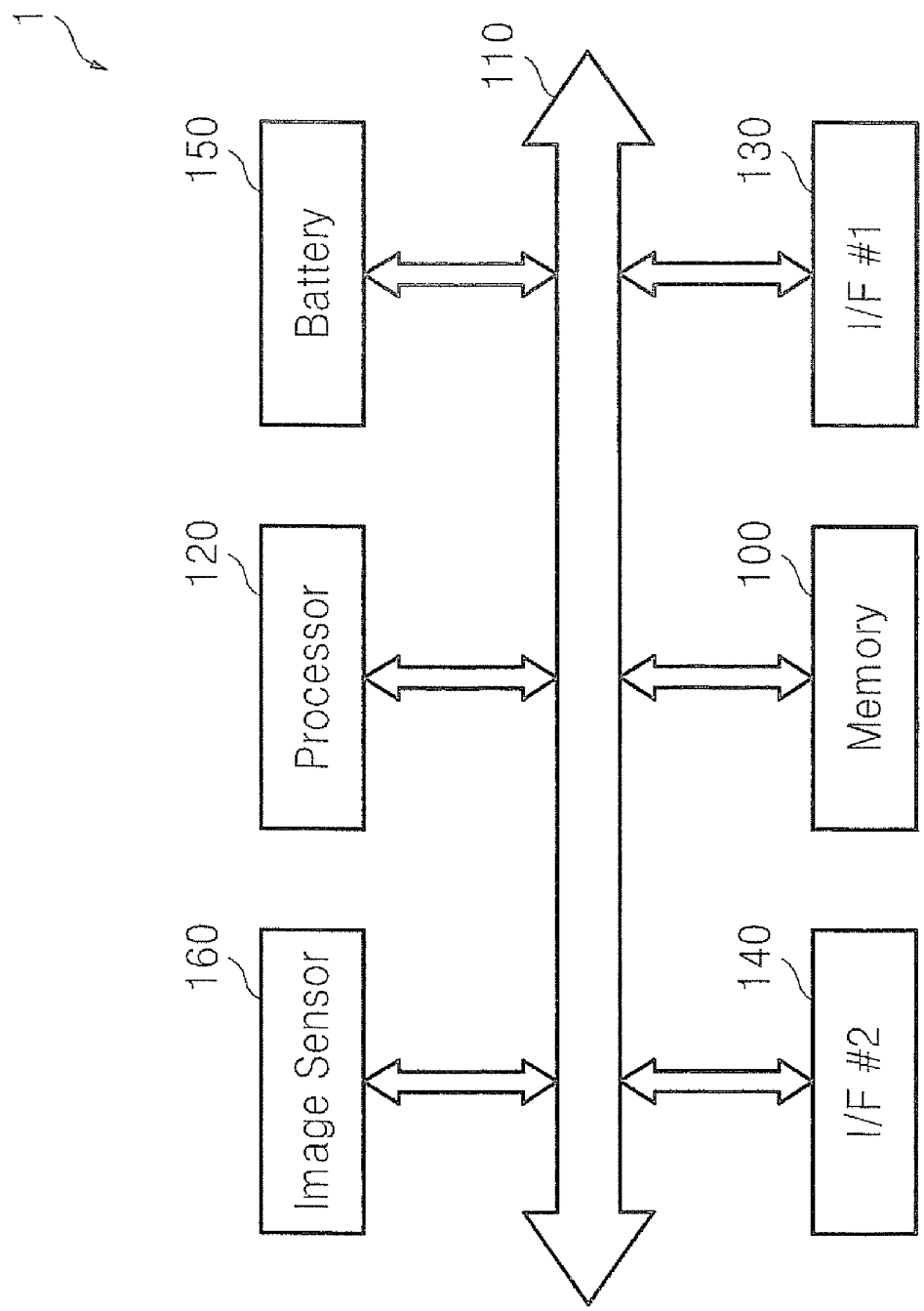
FIG. 12 is a schematic block diagram of a storage system including a memory apparatus according to some embodiments of the present invention.

FIG. 12 is a schematic block diagram of a storage system 1 including the memory apparatus 100 according to some embodiments of the present invention. Referring to FIG. 12, the storage system 1 may include the memory apparatus 100 and a processor 120, which are connected to a system bus 110.

The processor 120 may generate control signals for controlling the program (or write), read and/or verify operations of the memory apparatus 100. Accordingly, a control block (not shown) included in the storage system 1 may perform the program (or write) operation, the read operation, and/or the verify operation in response to a control signal output from the processor 120.

When the storage system 1 is embodied as a portable application, the storage system 1 may also include a battery 150 to supply operating power to the memory apparatus 100 and/or the processor 120. In some embodiments, the portable application may be a portable computer, a digital camera, a personal digital assistant (PDA), a cellular telephone, an MP3 player, a portable multimedia player (PMP), an automotive navigation system, a memory card, a system card, a game machine, an electronic dictionary, and/or a solid state disk, among others.

The storage system 1 may also include an interface (e.g., an input/output unit) 130 to communicate data with an external data processing device. When the storage system 1 is a wireless system, the storage system 1 may also include a wireless interface 140, which may be connected to the processor 120 and communicate data with an external wireless device through the system bus 110 via a wireless connection. The wireless system may include a wireless device such as PDA, a portable computer, a wireless telephone, a pager, a digital camera, a radio frequency identification (RFID) reader, and/or an RFID system, among others. The wireless system may also include a wireless local area network (WLAN) system and/or a wireless personal area network (WAN) system. Some embodiments provide that the wireless system may include a cellular network.

When the storage system 1 includes an image pick-up device, the storage system 1 may also include an image sensor 160 converting an optical signal into an electrical signal. The image sensor 160 may be an image sensor using a charge coupled device (CCD) and/or a complementary metal-oxide semiconductor (CMOS) image sensor, among others. In some embodiments, the storage system 1 may be a digital camera, a cellular telephone equipped with a digital camera, and/or a satellite system equipped with a camera, among others.

According to some embodiments of the present invention, page buffers may share program state information, so that an error that may occur in a memory cell can be rapidly corrected. In addition, since a reference level for a read operation may be changed based on disturbance and/or coupling affecting a cell due to adjacent cells, error occurrence in memory cells may be minimized.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A read compensation circuit comprising:
a plurality of memory cells comprising at least one erased cell;
a correction circuit that is configured to correct an error in the erased cell based on program state information of cells adjacent the erased cell; and
a control logic that is configured to output a control signal for correcting the program state information stored in the plurality of page buffers, wherein at least one of the plurality of page buffers corrects the program state information in response to the control signal,
wherein the correction circuit comprises a plurality of page buffers respectively connected with the plurality of memory cells and each of the page buffers stores the program state information of a memory cell connected with each page buffer among the plurality of memory cells and sends the program state information to other page buffers among the plurality of page buffers.

2. The read compensation circuit of claim 1, wherein the plurality of page buffers are divided into a first page buffer block and a second page buffer block separated from the first page buffer block by the plurality of memory cells,
wherein one of the first and second page buffer blocks sends the program state information to an other of the first and second page buffer blocks through a bit line.

3. The read compensation circuit of claim 1, wherein the at least one of the plurality of page buffers corrects the program state information of the erased cell whose total threshold voltage shift exceeds a predetermined value in response to the control signal.

4. The read compensation circuit of claim 3, wherein the total threshold voltage shift is determined based on at least one between program disturbance and coupling occurring due to the cells adjacent the erased cell.

5. The read compensation circuit of claim 1, wherein the plurality of page buffers perform a read operation using a first level as a reference and determine the program state information of the respective memory cells and the at least one of the plurality of page buffers performs a read operation using a second level greater than the first level in response to the control signal to correct the program state information of the erased cell.

6. The read compensation circuit of claim 1, wherein the correction circuit is a controller that is configured to receive the program state information from each of the memory cells and to check whether error correcting code (ECC) correction has been successful.

7. A read compensation circuit comprising:
a plurality of memory cells comprising at least one erased cell; and
a correction circuit that is configured to correct an error in the erased cell based on program state information of cells adjacent the erased cell,
wherein the correction circuit is a controller that is configured to receive the program state information from each of the memory cells and to check whether error correcting code (ECC) correction has been successful, and
wherein the controller comprises a read engine that is configured to correct the error in the erased cell based on the program state information of the cells adjacent the erased cell and, when the ECC correction has failed, the controller performs mapping conversion to convert the program state information received from the plurality of memory cells into physical data and input the physical data to the read engine.

8. The read compensation circuit of claim 7, wherein the read engine corrects the program state information of the erased cell whose total threshold voltage shift exceeds a predetermined value based on the physical data.

9. A read compensation circuit comprising:
a plurality of memory cells comprising at least one erased cell;
a correction circuit that is configured to correct an error in the erased cell based on program state information of cells adjacent the erased cell, the correction circuit comprising a plurality of page buffers that are connected to respective ones of the plurality of memory cells; and a control logic that is configured to output a control signal for correcting the program state information stored in the plurality of page buffers, wherein at least one of the plurality of page buffers corrects the program state information in response to the control signal.

10. The read compensation circuit of claim 9, wherein each of the page buffers stores the program state information of a memory cell connected with each page buffer among the plurality of memory cells and sends the program state information to other page buffers among the plurality of page buffers.

11. The read compensation circuit of claim 10, wherein the plurality of page buffers are divided into a first page buffer block and a second page buffer block separated from the first page buffer block by the plurality of memory cells, and wherein one of the first and second page buffer blocks sends the program state information to an other of the first and second page buffer blocks through a bit line.

12. The read compensation circuit of claim 10, wherein the at least one of the plurality of page buffers corrects the program state information of the erased cell whose total threshold voltage shift exceeds a predetermined value in response to the control signal.

13. The read compensation circuit of claim 12, wherein the total threshold voltage shift is determined based on at least one between program disturbance and coupling occurring due to the cells adjacent the erased cell.

14. The read compensation circuit of claim 10, wherein the plurality of page buffers perform a read operation using a first level as a reference and determine the program state information of the respective memory cells and the at least one of the plurality of page buffers performs a read operation using a second level greater than the first level in response to the control signal to correct the program state information of the erased cell.

15. The read compensation circuit of claim 9, wherein the correction circuit comprises a controller that is configured to receive the program state information from each of the memory cells and to check whether error correcting code (ECC) correction has been successful.

16. The read compensation circuit of claim 15, wherein the controller comprises a read engine that is configured to correct the error in the erased cell based on the program state information of the cells adjacent the erased cell and, when the ECC correction has failed, the controller performs mapping conversion to convert the program state information received from the plurality of memory cells into physical data and input the physical data to the read engine.

17. The read compensation circuit of claim 16, wherein the read engine corrects the program state information of the erased cell whose total threshold voltage shift exceeds a predetermined value based on the physical data.

18. A memory storage apparatus that includes a read compensation circuit according to claim 9.

* * * * *